(12) United States Patent
Okamura (10) Patent No.: US 8,299,759 B2
(45) Date of Patent: Oct. 30, 2012

(54) BATTERY PACK AND BATTERY CAPACITY CALCULATING METHOD

(75) Inventor: Hirohisa Okamura, Tokyo (JP)

(73) Assignee: Sony Corporation, Tokyo (JP)

( * ) Notice: Subject to any disclaimer, the term of this patent is extended or adjusted under 35 U.S.C. 154(b) by 298 days.

(21) Appl. No.: 12/687,467

(22) Filed: Jan. 14, 2010

(65) Prior Publication Data

US 2010/0201323 A1 Aug. 12, 2010

(30) Foreign Application Priority Data

Feb. 12, 2009 (JP) ................................. 2009-029492

(51) Int. Cl.
*H02J 7/00* (2006.01)
*H02J 7/16* (2006.01)

(52) U.S. Cl. ........ 320/134; 320/136; 320/137; 320/135; 320/132

(58) Field of Classification Search .................. 320/134, 320/135, 136, 132, 149, 137, 140, 148
See application file for complete search history.

(56) References Cited

U.S. PATENT DOCUMENTS

| | | | |
|---|---|---|---|
| 6,495,989 B1* | 12/2002 | Eguchi ........................... | 320/132 |
| 6,789,026 B2 | 9/2004 | Barsoukov et al. | |
| 7,078,907 B2* | 7/2006 | Uesaka et al. ................. | 324/429 |
| 7,136,762 B2* | 11/2006 | Ono ................................ | 702/63 |
| 7,405,571 B1* | 7/2008 | Liu ................................. | 324/430 |
| 7,977,916 B2* | 7/2011 | Hayakawa ..................... | 320/134 |
| 2008/0218127 A1* | 9/2008 | Kao et al. ....................... | 320/134 |
| 2008/0224665 A1* | 9/2008 | Matsumoto et al. ........... | 320/134 |
| 2008/0255783 A1* | 10/2008 | Tamai .............................. | 702/63 |
| 2008/0290835 A1* | 11/2008 | Hayashi ......................... | 320/112 |
| 2009/0027056 A1* | 1/2009 | Huang et al. ................... | 324/439 |
| 2009/0085519 A1* | 4/2009 | Kim ............................... | 320/134 |
| 2009/0140696 A1* | 6/2009 | Okuto ............................ | 320/134 |

FOREIGN PATENT DOCUMENTS

| | | |
|---|---|---|
| JP | 11-344544 | 12/1999 |
| JP | 2000-12103 | 1/2000 |
| JP | 2005-312239 | 11/2005 |
| JP | 2005-315730 | 11/2005 |

OTHER PUBLICATIONS

Office Action issued May 10, 2011 in Japanese Patent Application No. 2009-029492.

* cited by examiner

*Primary Examiner* — Edward Tso
*Assistant Examiner* — Alexis Boateng
(74) *Attorney, Agent, or Firm* — Oblon, Spivak, McClelland, Maier & Neustadt, L.L.P.

(57) ABSTRACT

A battery pack includes: at least one secondary battery; a first terminal and a second terminal to perform charge and discharge; a discharge control switch controlled by a first control signal, for turning on/off a discharge current; a charge control switch controlled by a second control signal, for turning on/off a charging current; and a control section to detect a voltage, a current, and a temperature of the secondary battery, control the charge control switch and the discharge control switch by outputting the first control signal and the second control signal in accordance with the voltage, the current, and the temperature of the secondary battery, and calculate a battery capacity of the secondary battery. The control section calculates the battery capacity of the secondary battery by different methods in accordance with respective cases where the secondary battery is being charged, being discharged, and in a fully charged state.

11 Claims, 7 Drawing Sheets

BATTERY PACK AND BATTERY CAPACITY CALCULATING METHOD

BACKGROUND OF THE INVENTION

1. Field of the Invention

The present invention relates to a battery pack and a charge control method used for a battery pack, and more particularly, to a battery pack and a battery capacity calculating method for calculating an appropriate battery capacity without using a correction table.

2. Description of the Related Art

In recent years, in portable electronic apparatuses such as laptop personal computers, cell phones, and PDAs (Personal Digital Assistants), battery packs using lithium-ion secondary batteries have been widely used as power sources thereof. The lithium-ion secondary batteries have advantages in lightweight, a large capacity, easiness of detecting a remaining capacity, and a long cycle life.

In a secondary battery of the battery pack, a full charge voltage and a discharge termination voltage are determined. A battery capacity at the discharge termination voltage is set to 0 mAh and a battery capacity at the full charge voltage is set to a so-called full charge capacity. In a case where the lithium-ion secondary battery is used, a battery voltage of 4.2 V is set for the full charge voltage and a battery voltage of 3.0 V is set for the discharge termination voltage for a single-cell lithium-ion secondary battery, for example. Then, actually flowing charging currents or discharge currents are integrated at a time of charge or discharge and thus the battery capacity can be calculated.

Further, as disclosed in U.S. Pat. No. 6,789,026 (hereinafter, referred to as Patent Document 1), a method of measuring a charge capacity using an OCV (Open Circuit Voltage) value of the secondary battery is also employed.

In such a method, there is a case where even when the integration result of the charging currents does not show a full charge capacity in a battery capacity calculation during the charge, full charge detection conditions like a condition in which the charging current takes a value equal to or lower than a charge termination current value are established. In this case, the battery capacity is forcibly corrected to a predetermined full charge capacity at a time at which the full charge detection conditions are established.

Further, there is also a case where the calculation result of the battery capacity exceeds the full charge capacity before the full charge detection conditions are established. In such a case, for example, after a remaining battery capacity ratio (so-called charge ratio) obtained based on the calculation result of the battery capacity becomes 99%, a user is being notified that the remaining battery capacity ratio is 99% by the time the full charge detection conditions are established even if the calculation result of the battery capacity exceeds the full charge capacity. When the full charge detection conditions are then established, the user is notified that the remaining battery capacity ratio is 100%.

It should be noted that since the charge capacity changes depending on a battery temperature, the integration result and the like are corrected using a temperature correction table.

SUMMARY OF THE INVENTION

However, the method of calculating the battery capacity by integrating the current values or the method of calculating the battery capacity by using the OCV as disclosed in Patent Document 1 cause a problem that the remaining battery capacity ratio to be notified to a user is not calculated precisely, for example. Such a problem tends to be caused in a secondary battery with a large degree of deterioration or when a battery temperature is largely deviated from room temperature.

Figure 1:
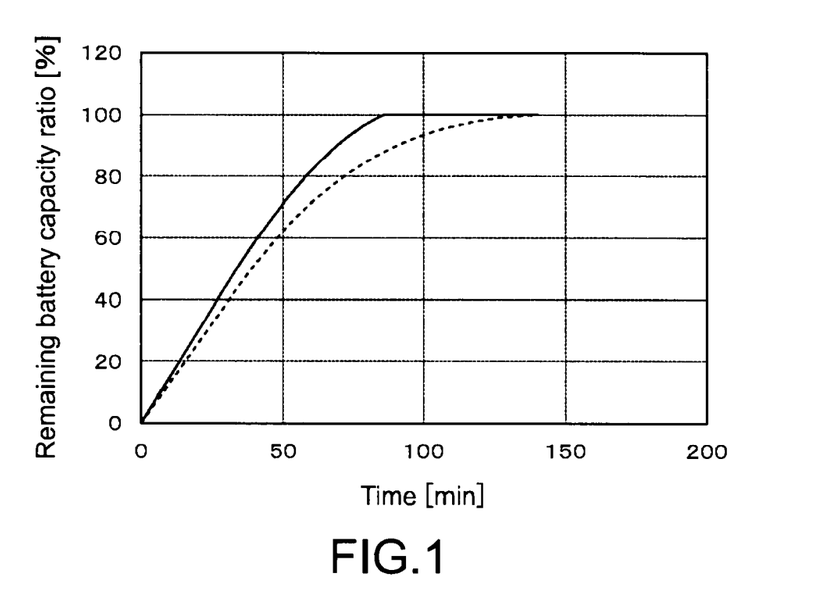
FIG. 1 is a graph showing a battery capacity in a case where the battery capacity is calculated by a method in related art.
Figure 2:
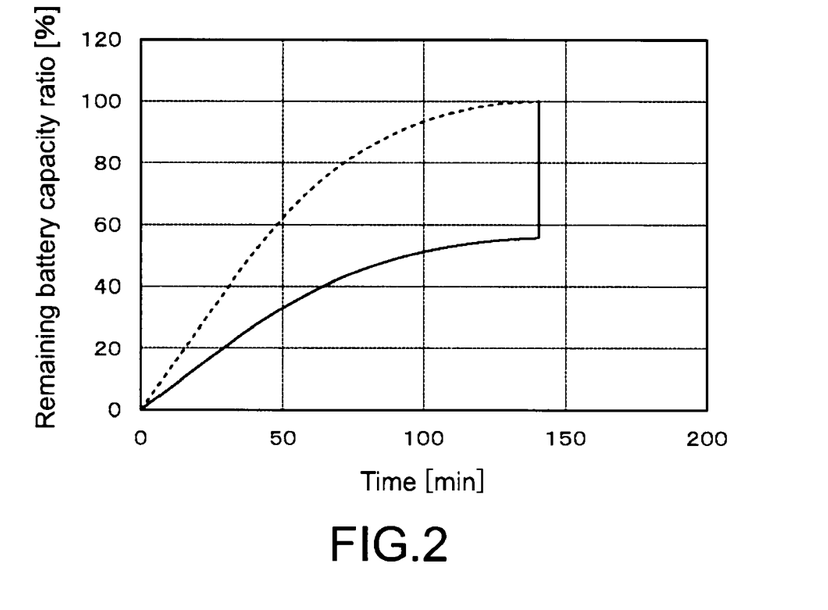
FIG. 2 is a graph showing a battery capacity in a case where the battery capacity is calculated by a method in related art.

Further, the full charge capacity also differs depending on discharge conditions (temperature, load, etc.) before charge, so an error is caused between a timing at which the full charge detection conditions are established and a full charge timing obtained based on the calculation result of the battery capacity when a full charge is detected. Therefore, in some charge/discharge conditions, there arises a problem that the user is notified that the remaining battery capacity ratio is 99% during ⅓ or more of the total charging time as shown in FIG. 1, for example. In addition, there arises a problem that the remaining battery capacity ratio is abruptly increased from 95% to 100% as shown in FIG. 2, for example, by forcibly setting a current battery capacity as a full charge capacity. It should be noted that graphs indicated by dotted lines in FIGS. 1 and 2 each show a general remaining battery capacity ratio at room temperature.

Accordingly, there is a need for a battery pack and a battery capacity calculating method for calculating an appropriate battery capacity without using a correction table.

According to an embodiment of the present invention, there is provided a battery pack including: at least one secondary battery; a first terminal and a second terminal that are connected to an external electronic apparatus and perform charge and discharge; a discharge control switch that is controlled by a first control signal and turns on/off a discharge current with respect to the secondary battery; a charge control switch that is controlled by a second control signal and turns on/off a charging current with respect to the secondary battery; and a control section to detect a voltage, a current, and a temperature of the secondary battery, control the charge control switch and the discharge control switch by outputting the first control signal and the second control signal in accordance with the voltage, the current, and the temperature of the secondary battery, and calculate a battery capacity of the secondary battery. The control section calculates the battery capacity of the secondary battery by different methods in accordance with respective cases where the secondary battery is being charged, being discharged, and in a fully charged state. In the case where the secondary battery is being charged, the control section calculates the battery capacity necessary to reach a full charge of the secondary battery by using a change amount of the charging current with respect to the battery capacity, and calculates the battery capacity of the secondary battery by using an adjustment value obtained based on the calculated battery capacity necessary to reach the full charge of the secondary battery.

According to another embodiment of the present invention, there is provided a battery capacity calculating method including: an initialization step of judging whether a past charging current of a secondary battery is stored in a storage section when the secondary battery is started to be charged, and in a state where the past charging current is not stored, measuring the charging current of the secondary battery and storing the charging current and a charge capacity obtained when the charge is started; a charge capacity calculation step of calculating the charge capacity of the secondary battery by integrating, in each certain cycle, the charging current that has flown in a predetermined cycle; a current change amount calculation step of calculating a current change amount that is a change amount of the charging current with respect to the charge capacity; an adjustment value calculation step of judging whether the secondary battery is being charged with one of a constant voltage and a constant current, when the secondary battery is being charged with the constant voltage, calculating a remaining charge capacity based on the charging current measured and the current change amount calculated in the current change amount calculation step and calculating an adjustment value from a difference between a full charge capacity with respect to the remaining charge capacity and the charge capacity, and when the secondary battery is being charged with the constant current, setting the adjustment value to 1; a battery capacity calculation step of calculating a battery capacity of the secondary battery by integrating, in each certain cycle, an adjustment charging current value calculated using a product of the charging current that has flown in a predetermined cycle and the adjustment value; a deterioration degree calculation step of calculating a degree of deterioration of the secondary battery from a ratio of the change amount of the charging current with respect to the charge capacity and the change amount of the charging current with respect to the charge capacity at a time when the secondary battery is started to be used, storing the calculated degree of deterioration in the storage section, and making an update; and a full charge capacity calculation step of calculating the full charge capacity by a product of an initial full charge capacity that has been stored in the storage section in advance and the degree of deterioration, storing the calculated full charge capacity in the storage section, and making an update in a case where the secondary battery is detected to be fully charged.

In the embodiments of the present invention, a change amount of a current with respect to the capacity at a time of charging. An adjustment value is calculated based on the change amount of a current, an adjustment charging current value that is a product of the adjustment value and a charging current value is integrated, thus calculating a charge capacity. Further, a degree of deterioration of a secondary battery is calculated based on the change amount of a current, and at a time of full charging, a full charge capacity is newly calculated using the degree of deterioration.

According to the embodiments of the present invention, it is possible to calculate a battery capacity in accordance with a state of the secondary battery without using a correction table storing a predetermined degree of deterioration or the like.

These and other objects, features and advantages of the present invention will become more apparent in light of the following detailed description of best mode embodiments thereof, as illustrated in the accompanying drawings.

DESCRIPTION OF PREFERRED EMBODIMENTS

Hereinafter, a mode for carrying out the present invention (hereinafter, referred to as embodiment) will be described. It should be noted that descriptions will be given as follows.

1. First Embodiment

Example of Calculating Battery Capacity Based on Change Amount of Charging Current with Respect to Charge Capacity Calculated when Charging)

1. First Embodiment

Hereinafter, a first embodiment of the present invention will be described with reference to the drawings.

(Circuit Structure of Battery Pack)

Figure 3:
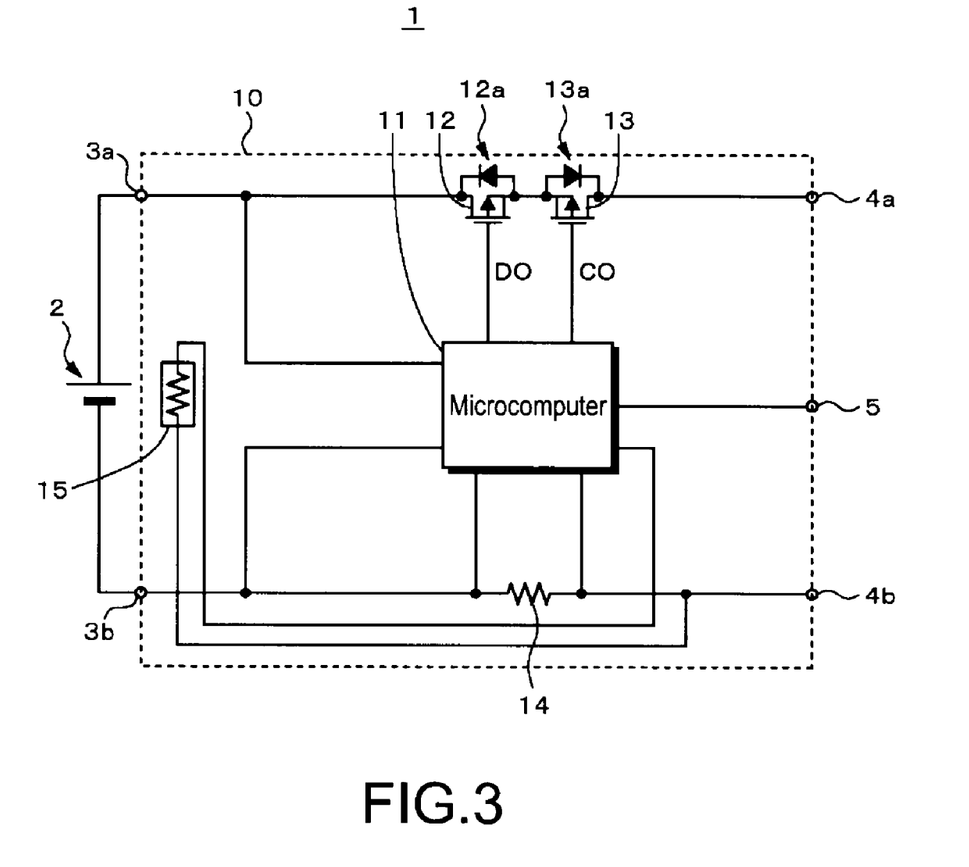
FIG. 3 is a circuit diagram showing a structural example of a battery pack of an embodiment of the present invention.

FIG. 3 is a circuit diagram showing a structural example of a battery pack of the first embodiment. A battery pack 1 includes a secondary battery 2, a battery connection positive terminal 3a, a battery connection negative terminal 3b, an external connection positive terminal 4a, an external connection negative terminal 4b, a communication terminal 5, and a protection circuit 10.

As the secondary battery 2, a lithium-ion secondary battery can be used, for example. Further, a plurality of secondary batteries 2 may be connected in series and/or in parallel.

The battery connection positive terminal 3a and the battery connection negative terminal 3b are connected to a positive terminal and a negative terminal of the secondary battery 2, respectively. The external connection positive terminal 4a and the external connection negative terminal 4b are connected to a positive terminal and a negative terminal of an external electronic apparatus or a charger (not shown), respectively. With this structure, the secondary battery 2 is charged and discharged via the protection circuit 10.

The communication terminal 5 is provided to perform communication with the electronic apparatus, and for example, transmits a state of the battery pack to the electronic apparatus and displays the status on the electronic apparatus as necessary. By providing the communication terminal 5, it is possible to light up an alarm lamp of the electronic apparatus in accordance with the state of the battery pack 1 or display the battery state such as a battery capacity on a display portion with the use of letters, icons, or the like, for example. Further, by communication between the electronic apparatus and the battery pack 1 via the communication terminal 5, it is also possible for the electronic apparatus to authenticate the battery pack 1 as a legitimate product or for the external apparatus to control charge and discharge of the secondary battery 2.

The protection circuit 10 includes a microcomputer 11 for performing a charge/discharge interruption control when abnormality occurs in the secondary battery 2, a discharge control FET (Field Effect Transistor) 12, a charge control FET 13, an overcurrent detection resistor 14, and a temperature detection device 15. It should be noted that in the embodiment of the present invention, p-channel type FETs are used for the discharge control FET 12 and the charge control FET 13. However, n-channel type FETs may be used. In a case where n-channel type FETs are used for the discharge control FET 12 and charge control FET 13, it is necessary to change arrangement positions of the FETs.

(Charge/Discharge Control Operation of Microcomputer)

The microcomputer 11 detects voltages at both ends of the overcurrent detection resistor 14 and equivalently detects a current flowing to the protection circuit 10 based on the detected voltages. In a case where a load current equal to or larger than a specified current value (that is, overcurrent) flows, the microcomputer 11 turns off the discharge control FET 12 or the charge control FET 13 to interrupt the load current. With this structure, damage to the secondary battery 2, the external electronic apparatus, and the protection circuit 10 is prevented.

The microcomputer 11 is provided with a ROM (Read Only Memory) and a RAM (Random Access Memory) as memories (not shown). As the ROM, an EEPROM (Electrically Erasable and Programmable Read Only Memory) or the like is provided, for example. In accordance with a program stored in the ROM in advance, the microcomputer 11 controls the respective portions with the RAM as a work memory. The RAM stores a measured voltage and current and a calculated battery capacity.

A parasitic diode 12a is provided between a drain and a source of the discharge control FET 12 and a parasitic diode 13a is provided between a drain and a source of the charge control FET 13. The parasitic diode 12a has a polarity in a forward direction with respect to a charging current flowing from the external connection positive terminal 4a toward the secondary battery 2 and in an opposite direction with respect to a discharge current flowing from the external connection negative terminal 4b toward the secondary battery 2. The parasitic diode 13a has a polarity in the opposite direction with respect to the charging current and in the forward direction with respect to the discharge direction.

A gate of the discharge control FET 12 is supplied with a control signal DO from the microcomputer 11 and a gate of the charge control FET 13 is supplied with a control signal CO from the microcomputer 11. In a normal discharge operation and charge operation, the control signal DO and the control signal CO are set to a logic "L" level (hereinafter, referred to as low level as appropriate) and the discharge control FET 12 and the charge control FET 13 are turned on. Since the discharge control FET 12 and the charge control FET 13 are of the p-channel type, they are turned on at a gate potential that is lower by a predetermined value or more than a source potential.

In a case where the microcomputer 11 detects that the voltage of the secondary battery 2 is equal to or lower than a predetermined discharge control voltage at a time of discharge, the control signal DO is set to a logic "H" level (hereinafter, referred to as high level as appropriate) and the discharge control FET 12 is turned off. Also in a case where it is detected that a discharge current is in an overcurrent state or a temperature of the secondary battery 2 is out of a predetermined range, the discharge control FET 12 is turned off. Accordingly, the discharge current is interrupted.

A discharge restoring voltage that is higher by a predetermined voltage than the discharge control voltage is set and stored in a memory (nonvolatile memory such as EEPROM) of the microcomputer 11. The microcomputer 11 continues to interrupt the discharge for a time period from a time at which the voltage of the secondary battery 2 is detected to be lower than a predetermined voltage value and the discharge is then interrupted to a time at which the voltage is increased to the discharge restoring voltage or more by performing charge or the like.

In a case where the discharge is interrupted because the discharge current is detected to be the overcurrent state, the discharge current becomes 0 and then the discharge can be restarted. In this case, it may be possible to set a predetermined delay time and interrupt the discharge in a case where the overcurrent state continues even when the delay time has elapsed, instead of immediately interrupting the discharge current when the overcurrent state is detected. For example, in a case where a plurality of secondary batteries 2 are connected in series so that the battery pack 1 is used at a high voltage, there may be a case where a large current flows for a very short time period when discharge is started. In many cases, such a large current may immediately return to a current having a normal value after flowing for a moment. Accordingly, by preventing discharge control from being immediately performed when such a large current flows, it is possible for a user to use an electronic apparatus comfortably.

It should be noted that generally, there is a fear that a battery pack that is extremely deteriorated due to overdischarge generates gas within the battery and the battery pack is expanded, which results from properties thereof. The battery pack is inserted into a battery pack insertion portion of the electronic apparatus when used. The battery pack insertion portion has a size that is substantially the same size as an outer dimension of the battery pack. Accordingly, when the battery pack is expanded, the battery pack is applied with an external pressure by an inner wall of the battery pack insertion portion and therefore the battery pack is damaged or an electrolytic solution is leaked from the battery pack. In addition, it becomes difficult to detach the battery pack from the battery pack insertion portion, which causes a fear that the battery pack is damaged when the battery pack is detached or the electronic apparatus is damaged. Accordingly, in a case where the voltage of the secondary battery 2 becomes equal to or lower than a discharge prohibiting voltage that is set to be lower than the discharge control voltage, charge and discharge may be controlled to be prohibited permanently. It is considered that after the voltage of the secondary battery 2 becomes lower than the discharge control voltage, the voltage further decreases to be equal to or lower than the discharge prohibiting voltage by self-discharge. For that reason, by controlling the charge and discharge to be prohibited permanently as described above, it is possible to further enhance safety.

Further, in a case where the microcomputer 11 detects that the voltage of the secondary battery 2 becomes equal to or higher than a predetermined charge control voltage at a time of charge, for example, the charge control FET 13 is turned off with the control signal CO being set to a logic "H" level (hereinafter, referred to as high level as appropriate). Also in a case where the charging current is detected to be the overcurrent state or a temperature of the secondary battery 2 is detected to be out of a predetermined range, the charge control FET 13 is turned off. Accordingly, the charging current is interrupted.

The charge control can be performed similarly at a time of charge. A charge restoring voltage that is lower by a predetermined voltage than the charge control voltage is set and stored in a memory of the microcomputer 11. The microcomputer 11 continues to interrupt the charge for a time period from a time at which the voltage of the secondary battery 2 is detected to be equal to or higher than a predetermined voltage value and the charge is then interrupted to a time at which discharge is performed or the voltage is decreased to the charge restoring voltage or lower by self-discharge, for example.

Also in a case where the overcurrent state is detected at a time of charge and charge is then interrupted, the charge may be interrupted in a case where the overcurrent state continues even when a predetermined delay time has elapsed, as in the case of discharge.

(Battery Capacity Calculating Method)

Hereinafter, a battery capacity calculating method for a battery pack according to the embodiment of the present invention will be described. In this embodiment of the present invention, a battery capacity is calculated in different methods in accordance with a state of the secondary battery 2. First, an operation of judging a battery state will be described with reference to FIG. 4.

Figure 4:
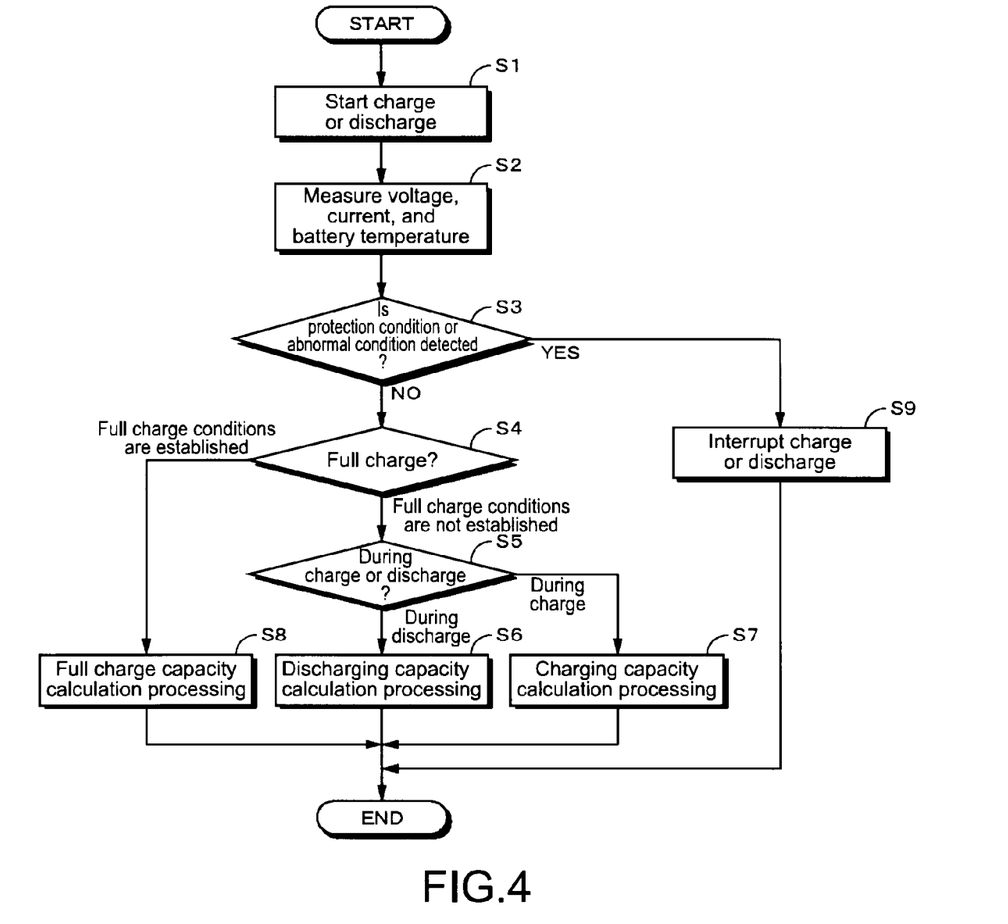
FIG. 4 is a flowchart showing a procedure of a battery capacity calculation of the battery pack of the embodiment of the present invention.

First, as shown in Step S1, charge or discharge is started. In Step S2, a voltage, a current, and a battery temperature of the secondary battery 2 are measured by the microcomputer 11.

Subsequently, in Step S3, it is judged whether the measured voltage, current, and battery temperature satisfy protection conditions for performing charge control or discharge control of the secondary battery 2 or abnormal conditions for permanently prohibiting charge and discharge.

Here, as the protection conditions, a discharge protection condition for discharge control and a charge protection condition for charge control are set.

The discharge protection condition includes the following conditions, for example.

(1) A case where a voltage of the secondary battery 2 becomes equal to or lower than a predetermined discharge control voltage (2) A case where a discharge current exceeds a predetermined value (that is, a case where a discharge current is detected to be overcurrent state)

(3) When a battery temperature is out of a predetermined range

In a case where a lithium-ion battery is used as the secondary battery 2, a discharge control voltage is set to, for example, 2.5 V. Overcurrent conditions of the discharge current are determined based on resistances of components used for a protection circuit, components of the electronic apparatus, and the like. Conditions of the battery temperature are determined based on materials used for a positive electrode, a negative electrode, an electrolyte, and the like of the secondary battery 2. The discharge current is interrupted by turning off the discharge control FET 12.

On the other hand, the charge protection condition includes the following conditions, for example.

(1) A case where a voltage of the secondary battery 2 becomes equal to or higher than a predetermined charge control voltage (2) A case where a charging current exceeds a predetermined value (that is, a case where a charging current is detected to be overcurrent state)

(3) When a battery temperature is out of a predetermined range

The protection conditions can be set arbitrary based on performance of the secondary battery 2. In a case where a lithium-ion secondary battery is used as the secondary battery 2, a charge control voltage is set to, for example, 4.2 V. The overcurrent conditions of the charging current and conditions of the battery temperature are determined similarly in the case of the discharge. It should be noted that an appropriate range of the battery temperature may be set to the same range when performing charge and discharge, or may be set to different ranges. The charging current is interrupted by turning off the charge control FET 13.

Further, the abnormal conditions include the following conditions, for example.

(1) A case where a voltage of the secondary battery 2 becomes equal to or lower than a discharge prohibiting voltage that is set to be lower than a discharge control voltage, or becomes equal to or higher than a charge prohibiting voltage that is set to be higher than a charge control voltage (2) A case where the secondary battery 2 generates heat abnormally Temperature conditions of the heat abnormally generated by the secondary battery 2 are determined based on heat resistance of circuit components of the secondary battery 2, a melting point of a separator or the like, safety of the entire secondary battery 2, and are set to about 90 to 100° C., for example.

In a case where it is detected in Step S3 that the state of the secondary battery 2 satisfies the protection conditions or the abnormal conditions, the processing proceeds to Step S9. In Step S9, control of charge or discharge is performed and the processing is ended.

It should be noted that when the charge or the discharge is interrupted in Step S9, the charge control FET 13 or the discharge control FET 12 is turned off. For example, when an overcharge state is detected and the charge is interrupted, the charge control FET 13 is turned off. In a case where a battery voltage is then decreased to be equal to or lower than a predetermined charge restoring voltage, the charge control FET 13 is turned on and charge is allowed. After that, when charge is restarted, the processing is performed from Step S1 again, for example.

In a case where it is not detected in Step S3 that the state of the secondary battery 2 satisfies the protection conditions or the abnormal conditions, that is, it is detected that the state is normal, the processing proceeds to Step S4. In Step S4, it is judged whether the secondary battery 2 is in a fully charged state. In a case where full charge conditions are satisfied regarding the secondary battery 2, the processing proceeds to Step S8. In Step S8, full charge capacity calculation processing is performed and thereafter the processing is ended. The full charge capacity calculation processing will be described later.

In Step S4, in a case where the full charge conditions are not satisfied regarding the secondary battery 2, the processing proceeds to Step S5, and it is judged whether the secondary battery 2 is being charged or discharged. The judgment whether the secondary battery 2 is being charged or discharged is performed based on a polarity of a flowing current. In other words, in a case where a direction in which a charging current flows is set as a positive current value, it is judged that the secondary battery 2 is being charged when a current >0 [A] is satisfied, or it is judged that the secondary battery 2 is being discharged when a current <0 [A] is satisfied.

In a case where it is judged in Step S5 that the secondary battery 2 is being discharged, the processing proceeds to Step S6. In Step S6, discharging capacity calculation processing is performed and thereafter the processing is ended. The discharging capacity calculation processing will be described later.

In a case where it is judged in Step S5 that the secondary battery 2 is being charged, the processing proceeds to Step S7. In Step S7, charging capacity calculation processing is performed and thereafter the processing is ended. The charging capacity calculation processing will be described later.

Such processing are performed per second, for example. In the discharging capacity calculation processing of Step S6 and the charging capacity calculation processing of Step S7, a capacity is calculated by continuing to integrate currents that flows for a second.

(Discharging Capacity Calculation Processing)

In the discharging capacity calculation processing, a discharge capacity is calculated by integrating discharge currents. The discharge capacity is obtained by the following formula (1). The following formula (1) is used for calculating a discharge capacity (n) obtained n seconds after discharge is started. It should be noted that a battery capacity (remaining capacity) of the secondary battery 2 is calculated from a difference between a battery capacity obtained when discharge is started and a discharge capacity.

$$\text{Discharge capacity } (n) = \text{discharge capacity } (n-1) + (\text{discharge current}/3600) \quad (1)$$

A full charge capacity of the secondary battery 2 in the discharging capacity calculation processing can be obtained from a discharge capacity obtained by integrating discharge currents until the discharge is ended. The full charge capacity is stored in the memory of the microcomputer 11 as a full charge capacity of the secondary battery 2 at that moment.

Further, the full charge capacity may be obtained from a discharge capacity (97%) at a time when 97% of discharge is performed, for example, as shown in the following formula (2).

$$\text{Full charge capacity} = \text{discharge capacity } (97\%)/0.97 \quad (2)$$

(Charging Capacity Calculation Processing)

In the charging capacity calculation processing, a charge capacity is calculated by integrating charging currents. When charging the secondary battery 2, CC (Constant Current) charging is performed so that a voltage of the secondary battery 2 becomes a full charge voltage, and thereafter CV (Constant Voltage) charging is performed. Then, a charging current during the CV charging is measured and the charge is continued until the charging current becomes equal to or lower than a predetermined charge termination current value.

In the embodiment of the present invention, a remaining charge capacity that is a capacity up to a full charge in a CV charging region is calculated. Then, a charge adjustment value is set such that a difference between a charge capacity and a full charge capacity stored at that time is close to the calculated remaining charge capacity, and an integration value is adjusted.

Figure 5A:
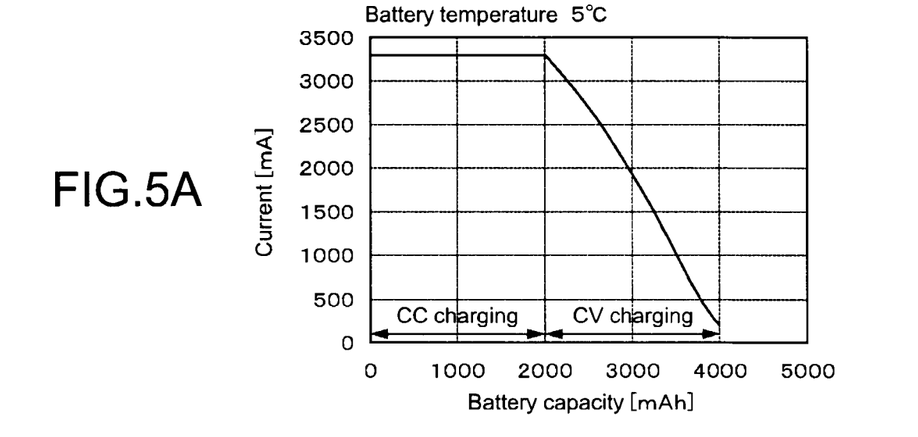
FIG. 5 are graphs showing a change of a charging current at a time of charge.
Figure 5B:
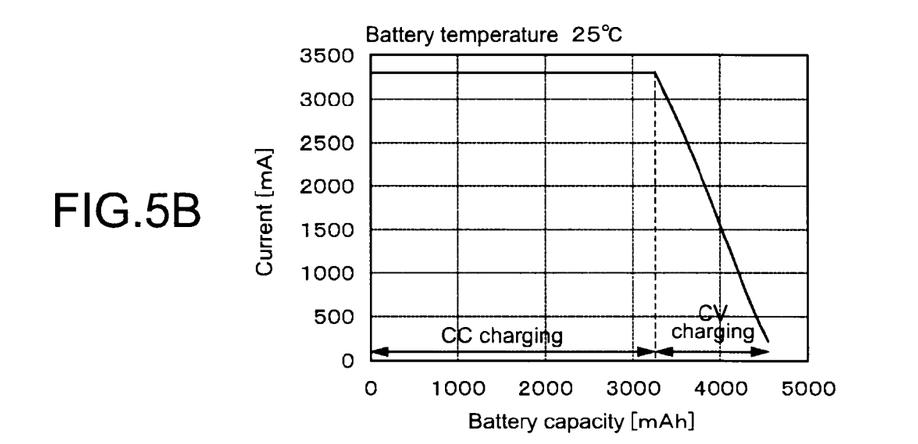
Figure 5C:
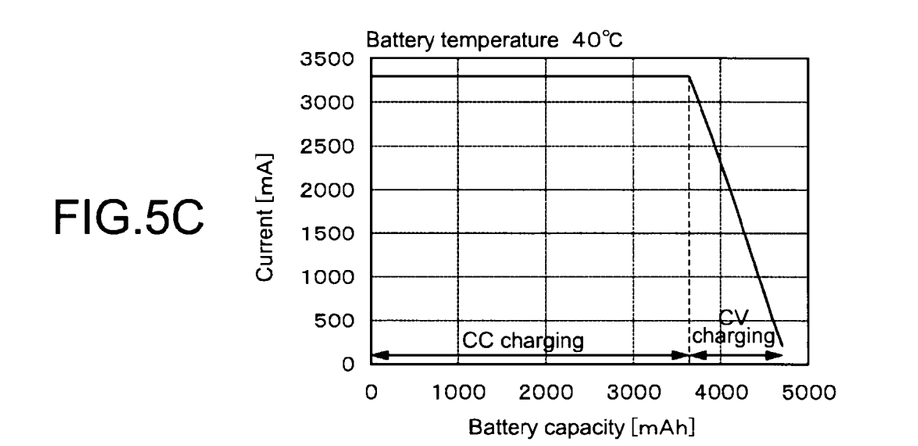

As the method of calculating the remaining charge capacity, as shown in FIG. 5, an approximate proportional relationship between a current change amount in which a current is changed and a change amount of a charge capacity is used in the CV charging. FIGS. 5A to 5C are graphs each showing a relationship between a charging current and a charge capacity in a case where a current condition in the CC charging is set to 3.3 A, a voltage condition in the CV charging is set to 4.2 V per cell, and a charge termination current is set to 250 mA. FIG. 5A is a graph in which a battery temperature of a secondary battery is set to 5° C., FIG. 5B is a graph in which the battery temperature of the secondary battery is set to 25° C., and FIG. 5C is a graph in which the battery temperature of the secondary battery is set to 40° C.

As seen from FIGS. 5A to 5C, a change of the charging current (inclination of graph) becomes substantially constant in the CV charging region. Accordingly, in the embodiment of the present invention, a charge capacity necessary to be charged up to reaching the full capacity is obtained based on a change amount of the charging current. It should be noted that when the battery temperature of the secondary battery is decreased and an internal resistance is increased, a change amount of the charging current is decreased. Accordingly, the inclination becomes gentle as the battery temperature of the secondary battery is reduced.

Figure 6:
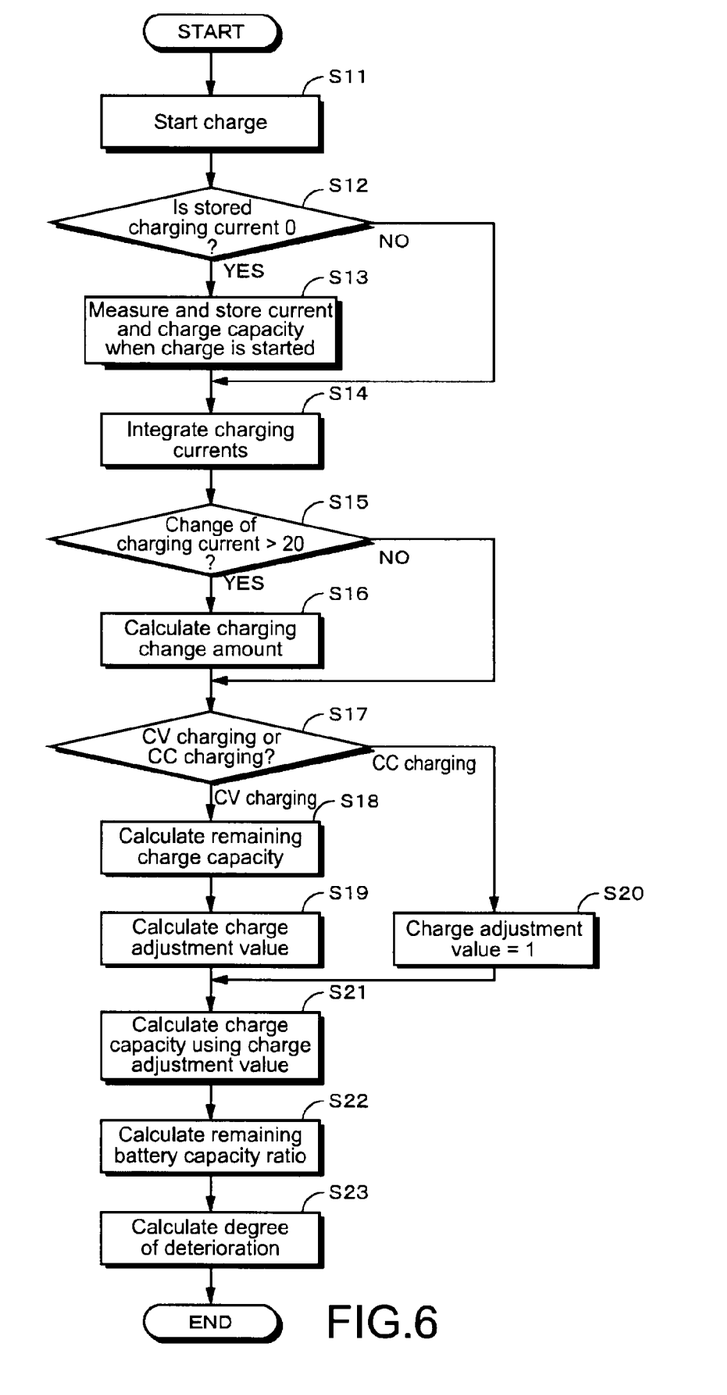
FIG. 6 is a flowchart showing a procedure of the battery capacity calculation at the time of charging the battery pack of the embodiment of the present invention.

With reference to a flowchart of FIG. 6, a flow of the charging capacity calculation processing will be described. It should be noted that in the charging capacity calculation processing in the embodiment of the present invention, the following processing is performed per second. Then, a measured charging current and a calculated charge capacity are stored, and when the charging capacity calculation processing is performed, the stored past charging current and charge capacity are read out to thus perform the charging capacity calculation processing.

First, upon start of charge in Step S11, it is judged in Step S12 whether a charging current stored in the past is 0 [mAh]. The charging current stored in the past is cleared in discharge processing. Accordingly, when the discharge processing is switched to the charge processing, a numerical value of the charging current stored in the past is set to 0. When the charge processing is restarted, the numerical value of the charging current stored in the past is stored.

In a case where it is judged in Step S12 that the stored charging current is not 0, the processing proceeds to Step S14. In a case where it is judged in Step S12 that the stored charging current is 0, a present charging current and a present charge capacity are measured and stored in Step S13.

Subsequently, in Step S14, charging currents are integrated and a charge capacity is calculated. The charge capacity is obtained by the following formula (3). In the following formula (3), a charge capacity (n) obtained n seconds after charge is started is calculated.

$$\text{Charge capacity } (n) = \text{charge capacity } (n-1) + (\text{charging current}/3600) \quad (3)$$

Then, it is judged in Step S15 whether the charging current at that time is changed by a predetermined value, for example, more than 20 mA, with respect to the charging current stored in the past. When it is judged in Step S15 that a change of the charging current is small, the processing proceeds to Step S17.

In a case where it is judged in Step S15 that a change of the charging current exceeds a predetermined value, a charging change amount that is a change amount of the charging current with respect to the charge capacity is calculated in Step S16. The charging change amount is obtained by the following formula (4).

$$\text{Charging change amount} = (\text{charge capacity stored in past} - \text{measured charge capacity})/(\text{charging current stored in past} - \text{measured charging current}) \quad (4)$$

In the formula (4), the charging change amount is calculated by calculating differences between the charging current and that stored in the past and between the charge capacity and that stored in the past. After the charging change amount is calculated, a present charging current and a present charge capacity are stored. It should be noted that a charging change amount obtained at a first charge operation (change amount of current at a start of using a battery) is stored in a memory of the microcomputer 11. The change amount of current at a start of using a battery is used for calculating a degree of deterioration every time a charge operation is performed.

Figure 7:
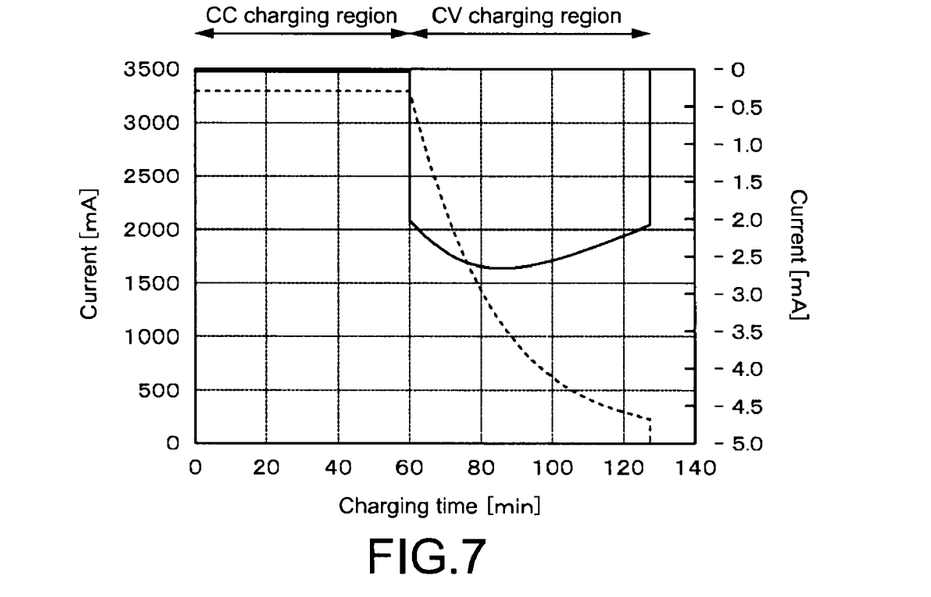
FIG. 7 is a graph showing a current change amount and the change of the charging current at the time of charging the battery pack of the embodiment of the present invention.

FIG. 7 is a graph showing a charging current, a measured charge capacity, and a charge capacity calculated by using a charge adjustment value in the CV charging region. In FIG. 7, a solid line indicates a charging current and a dotted line indicates a charging change amount calculated in the formula (4). It should be noted that the charging change amount indicated by the dotted line is a schematic graph, and variations (differences between maximum value and minimum value) are actually generated. However, the variations are about 0.1 and the influence due to the variations is 5% or less with respect to a full charge capacity.

Subsequently, the charge adjustment value is calculated. The charge adjustment value is separately used in the CC charging and CV charging. Accordingly, it is judged in Step S17 whether the CC is charged or the CV is charged. Specifically, it is judged in Step S17 whether a charging change amount $\leq -1$ is satisfied. When the charging change amount $\leq -1$ is satisfied, it is judged to be a CV charging state. On the other hand, when the charging change amount $\leq -1$ is not satisfied, it is judged to be a CC charging state.

When it is judged to be the CC charging in Step S17, it is assumed that a charge adjustment value is 1, that is, adjustment is not performed in Step S20. When it is judged to be the CV charging in Step S17, the processing proceeds to Step S18. In Step S18, a remaining charge capacity is calculated. The remaining charge capacity is calculated by the following formula (5) using the charging change amount.

$$\text{Remaining charge capacity} = -(\text{charging current} - \text{charge termination current})/\text{charging change amount} \tag{5}$$

Figure 8:
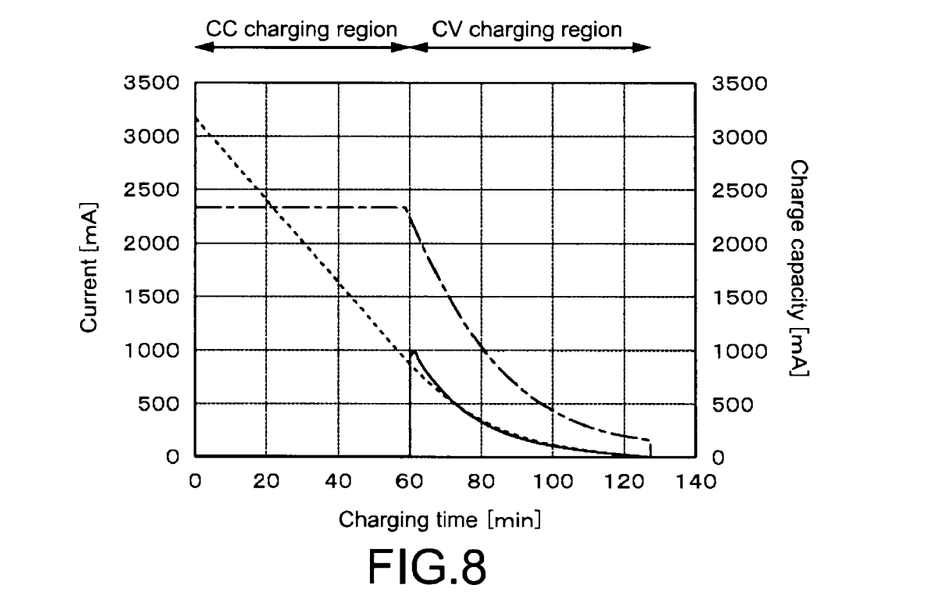
FIG. 8 is a graph showing the charging current, a measured charge capacity, and a charge capacity calculated by using a charge adjustment value in a constant voltage charging region, of the battery pack of the embodiment of the present invention.

FIG. 8 is a graph showing the calculated remaining charge capacity and the measured remaining charge capacity. In FIG. 8, a solid line indicates a remaining charge capacity calculated in the CV charging region and a dotted line indicates a measured remaining charge capacity. Further, a broken line indicates a charging current.

As shown in FIG. 8, the remaining charge capacity in the CV charging region that is calculated by the formula (5) has a smaller error with the measured remaining charge capacity as the charge is advanced, and both the remaining charge capacities substantially coincide with each other at a late stage of the charge.

Then, the processing proceeds to Step S19 so that a charge adjustment value in the CV charging is calculated. The charge adjustment value is obtained by the following formula (6) by using the remaining charge capacity calculated in Step S18.

$$\text{Charge adjustment value} = (\text{full charge capacity} - \text{charge capacity})/\text{remaining charge capacity} \tag{6}$$

Upon calculation of the charge adjustment value, the processing proceeds to Step S21.

Here, in the CV charging region, a charge capacity calculated as a capacity ranging from a present charge capacity to a full charge capacity is varied depending on how to define the charge adjustment value. The full charge capacity is represented by each of the following formulae (7) and (8).

First formula for calculating full charge capacity in CV charging region $$\begin{aligned}\text{Full charge capacity} &= \text{present charge capacity} + \\ &\text{calculated capacity up to full charge} \times \text{charge adjustment value} = \\ &\text{present charge capacity} + \Sigma(\text{charging currents}) \times \\ &\text{charge adjustment value} = \\ &\text{present charge capacity} + \Sigma(\text{charging currents} \times \\ &\text{charge adjustment value})\end{aligned} \tag{7}$$

The first formula is a method of calculating a full charge capacity by multiplying a remaining charge capacity by a predetermined charge adjustment value.

Second formula for calculating full charge capacity in CV charging region $$\begin{aligned}\text{Full charge capacity} &= \text{present charge capacity} + \text{calculated capacity up to full charge} + \text{charge adjustment value} \\ &= \text{present charge capacity} + \Sigma(\text{charging currents}) + \text{charge adjustment value}\end{aligned} \tag{8}$$

The second formula is a method of calculating a full charge capacity from the sum of the present charge capacity, the remaining charge capacity, and a predetermined charge adjustment value.

Figure 9A:
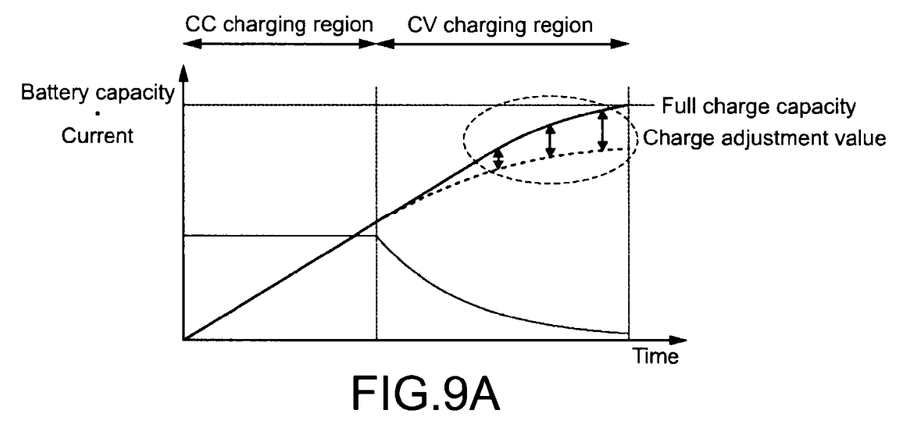
FIG. 9 are graphs showing a first and second examples of a charge capacity calculated using the charge adjustment value in the embodiment of the present invention.
Figure 9B:
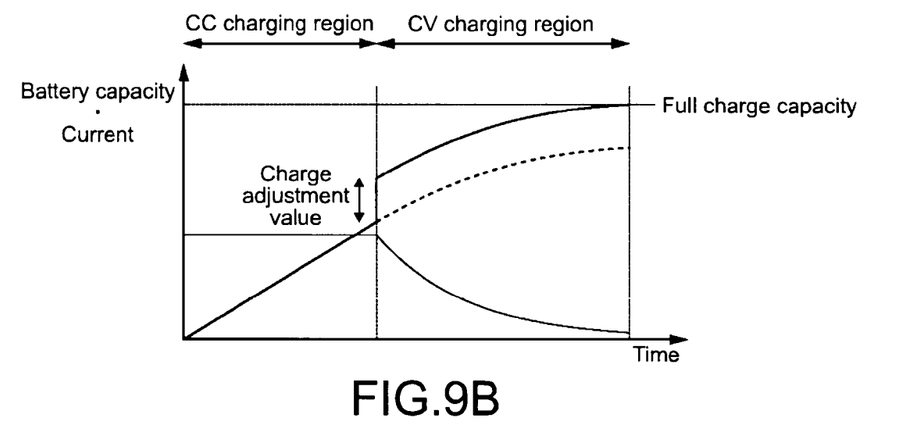

Here, FIG. 9A is a graph showing a charge capacity calculated using the charge adjustment value in the above formula (7) in the CV charging region. FIG. 9B is a graph showing a charge capacity calculated using the charge adjustment value in the above formula (8). In FIGS. 9A and 9B, dotted lines are graphs indicating a charge capacity in a case of using no charge adjustment value.

As shown in FIGS. 9A and 9B, the influence on the charge capacity calculation differs in using any of the formulae (7) and (8). In FIG. 9B, the charge capacity can be calculated by adding a constant charge adjustment value to the charge capacity irrespective of the remaining charge capacity in the CC charging region. However, in this method, the charge capacity is abruptly changed when the CC charging is switched to the CV charging. Accordingly, in the embodiment of the present invention, the charge adjustment value in the formula (7) is used.

In Step S21, the charge capacity is calculated. As described above, the charge adjustment value of the formula (7) is used in the embodiment of the present invention. Accordingly, a battery capacity obtained n seconds after charge is started is calculated by the following formula (9).

$$\text{Charge capacity }(n) = \text{charge capacity }(n-1) + (\text{charging current}/3600) \times \text{charge adjustment value} \tag{9}$$

The calculated charge capacity is stored in the memory.

Then, the processing proceeds to Step S22, and a remaining battery capacity ratio is calculated by the following formula (10).

$$\text{Remaining battery capacity ratio} = (\text{charge capacity}/\text{full charge capacity}) \times 100 \tag{10}$$

Data indicating the calculated remaining battery capacity ratio is transmitted to an external electronic apparatus main body via the communication terminal 5, and the electronic apparatus displays the remaining battery capacity ratio on a display portion or the like with the use of letters, icons, or the like, with the result that a user can intuitively understand a charge status (dischargeable status) of the secondary battery 2.

Subsequently, in Step S23, a present degree of deterioration of the secondary battery 2 is calculated. The degree of deterioration is not stored in advance but calculated using a numerical value that is actually measured in each charge operation. Accordingly, the degree of deterioration in accordance with the status of the secondary battery 2 can be obtained.

The degree of deterioration is calculated by the following formula (11). The current change amount at a time of starting to use a battery is stored in the memory of the microcomputer 11 when the charge operation is first performed.

$$\text{Degree of deterioration} = \text{current change amount}/\text{current change amount at time of starting to use battery} \tag{11}$$

It should be noted that when the current change amount at a time of starting to use a battery is 0 in calculating the degree of deterioration, 0 is replaced with a current change amount currently stored. Further, the calculation of the degree of deterioration is executed depending on a temperature condition. For example, when a battery temperature exceeds 30° C., the degree of deterioration is not calculated. The calculated degree of deterioration is stored in the memory and is used in the full charge capacity calculation processing.

The above degree of deterioration has an initial value of about 1, which is set to become smaller as a charge/discharge cycle of the secondary battery 2 is advanced. The degree of deterioration is represented by a ratio of the current change amount to the current change amount at the time of starting to use the battery. As the secondary battery 2 becomes deteriorated, a current change amount that is a change amount of the charging current with respect to a predetermined battery capacity becomes small, that is, the inclination of the graph becomes close to 0. Accordingly, the degree of deterioration becomes small as deterioration is advanced.

(Full Charge Capacity Calculation Processing)

The full charge capacity calculation processing performed in Step S8 will be described. In a case where it is judged in Step S4 that the full charge conditions are established, the battery capacity of the secondary battery 2 is forcibly set to a full charge capacity in Step S8. The full charge capacity is obtained by the following formula (12).

Full charge capacity=full charge capacity at shipping× degree of deterioration        (12)

Here, the full charge capacity at the shipping is stored in a memory of the microcomputer 11. Moreover, the initial value of the degree of deterioration is set to 1 and stored in the memory of the microcomputer 11.

Generally, a capacity that has been actually discharged at a time of discharge is set to the full charge capacity. In this case, discharge is necessary to be performed until the discharge is nearly terminated. However, since a laptop personal computer or the like is frequently used with an AC adapter, the discharge performed until the discharge is nearly terminated becomes less frequent. Accordingly, a change of the full charge capacity due to the deterioration of the battery or the like is difficult to be understood in a method of related art.

In the embodiment of the present invention, in a case where the degree of deterioration of the battery is calculated when the battery is charged and the full charge conditions of the secondary battery are established, the full charge capacity is calculated and stored using the degree of deterioration calculated at the charge. Accordingly, the deterioration of the full charge capacity is updated every time the secondary battery is charged, with the result that the battery state can be precisely obtained.

By using the battery capacity calculating method as described above, it can be prevented that the remaining battery capacity ratio that is notified to a user is abruptly increased and shows a full charge state or that a state right before the full charge, such as a state in which the remaining battery capacity ratio is 99%, is notified for a long time.

In the embodiment of the present invention, an appropriate battery capacity can be calculated without using a correction table.

As described above, the embodiment of the present invention has been specifically described, but the present invention is not limited thereto and various modifications based on the technical idea of the present invention can be made.

For example, numerical values used in the above embodiment of the present invention are merely examples, and numerical values different from the above values may be used as necessary. Since judging criteria on the battery state is different in accordance with types of the secondary battery, appropriate reference values are set in accordance with used secondary batteries.

The present application contains subject matter related to that disclosed in Japanese Priority Patent Application JP 2009-029492 filed in the Japan Patent Office on Feb. 12, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A battery pack, comprising:
   at least one secondary battery;
   a first terminal and a second terminal that are connected to an external electronic apparatus and perform charge and discharge;
   a discharge control switch that is controlled by a first control signal and turns on/off a discharge current with respect to the secondary battery;
   a charge control switch that is controlled by a second control signal and turns on/off a charging current with respect to the secondary battery; and
   a control section to detect a voltage, a current, and a temperature of the secondary battery, control the charge control switch and the discharge control switch by outputting the first control signal and the second control signal in accordance with the voltage, the current, and the temperature of the secondary battery, and calculate a battery capacity of the secondary battery, wherein the control section calculates the battery capacity of the secondary battery by different methods in accordance with respective cases where the secondary battery is being charged, being discharged, and in a fully charged state, and wherein in the case where the secondary battery is being charged, the control section calculates the battery capacity necessary to reach a full charge of the secondary battery by using a change amount of the charging current with respect to the battery capacity, and calculates the battery capacity of the secondary battery by using an adjustment value obtained based on the calculated battery capacity necessary to reach the full charge of the secondary battery, and
   in a case where the secondary battery is being charged with a constant voltage, the control section calculates the adjustment value from a ratio of the battery capacity necessary to reach the full charge of the secondary battery, the battery capacity being calculated using the change amount of the charging current with respect to the battery capacity, to a difference between the battery capacity of the secondary battery in the fully charged state and the battery capacity of the secondary battery at that time, and wherein in a case where the secondary battery is being charged with a constant current, the adjustment value is set to 1.

2. The battery pack according to claim 1, wherein the control section stores the change amount of the charging current with respect to the battery capacity in a storage section and make an update each time the change amount of the charging current with respect to the battery capacity is calculated.

3. The battery pack according to claim 2, wherein the control section stores a value of the charging current in the storage section and make an update each time the charging current is measured, and wherein the control section calculates the change amount of the charging current with respect to the battery capacity in a case where a difference between a value of the measured charging current and the value of the charging current that is stored in the storage section exceeds a predetermined value.

4. The battery pack according to claim 3, wherein the control section clears the charging current stored in the storage section in a case where it is judged that the secondary battery is being discharged.

5. The battery pack according to claim 4, wherein the control section calculates the battery capacity of the secondary battery by integrating, in each certain cycle, an adjustment charging current value calculated by a product of the charging current that has flown in a predetermined cycle and the adjustment value.

6. The battery pack according to claim 5, wherein the battery capacity of the secondary battery that is calculated by integrating the adjustment charging current value and a full charge capacity of the secondary battery are used to calculate a remaining battery capacity ratio.

7. The battery pack according to claim 6, further comprising a third terminal to perform communication with the external electronic apparatus, wherein the remaining battery capacity ratio is output via the third terminal.

8. The battery pack according to claim 1, wherein the control section calculates a degree of deterioration of the secondary battery from a ratio of the change amount of the charging current with respect to the battery capacity and the change amount of the charging current with respect to the battery capacity at a time when the secondary battery is started to be used, stores the calculated degree of deterioration in the storage section, and makes an update.

9. The battery pack according to claim 8, wherein in a case where the change amount of the charging current with respect to the battery capacity at the time when the secondary battery is started to be used is 0, the change amount of the charging current with respect to the battery capacity at the time when the secondary battery is started to be used is replaced with the change amount of the charging current with respect to the battery capacity, the change amount being stored in the storage section.

10. The battery pack according to claim 9, wherein the control section calculates the full charge capacity by a product of an initial full charge capacity that has been stored in the storage section in advance and the degree of deterioration stored in the storage section in a case where the secondary battery is detected to be fully charged.

11. A battery capacity calculating method, comprising:
judging whether a past charging current of a secondary battery is stored in a storage section when the secondary battery is started to be charged, and in a state where the past charging current is not stored, measuring the charging current of the secondary battery and storing the charging current and a charge capacity obtained when the charge is started;
calculating the charge capacity of the secondary battery by integrating, in each certain cycle, the charging current that has flown in a predetermined cycle;
calculating a current change amount that is a change amount of the charging current with respect to the charge capacity;
judging whether the secondary battery is being charged with one of a constant voltage and a constant current, when the secondary battery is being charged with the constant voltage, calculating a remaining charge capacity based on the charging current measured and the current change amount, calculating an adjustment value from a ratio of a battery capacity necessary to reach the full charge of the secondary battery, the battery capacity being calculated using the change amount of the charging current with respect to the battery capacity, to a difference between the battery capacity of the secondary battery in a fully charged state and the battery capacity of the secondary battery at that time, and when the secondary battery is being charged with the constant current, setting the adjustment value to 1;
calculating a battery capacity of the secondary battery by integrating, in each certain cycle, an adjustment charging current value calculated using a product of the charging current that has flown in a predetermined cycle and the adjustment value;
calculating a degree of deterioration of the secondary battery from a ratio of the change amount of the charging current with respect to the charge capacity and the change amount of the charging current with respect to the charge capacity at a time when the secondary battery is started to be used, storing the calculated degree of deterioration in the storage section, and making an update; and
calculating the full charge capacity by a product of an initial full charge capacity that has been stored in the storage section in advance and the degree of deterioration, storing the calculated full charge capacity in the storage section, and making an update in a case where the secondary battery is detected to be fully charged.

* * * * *